(12) United States Patent
Shibata

(10) Patent No.: US 9,793,908 B2
(45) Date of Patent: Oct. 17, 2017

(54) PROTECTION CIRCUITS FOR TUNABLE RESISTOR AT CONTINUOUS-TIME ADC INPUT

(71) Applicant: Analog Devices Global

(72) Inventor: Hajime Shibata, Toronto (CA)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/360,816

(22) Filed: Nov. 23, 2016

(65) Prior Publication Data
US 2017/0179968 A1    Jun. 22, 2017

(51) Int. Cl.
| | | |
|---|---|---|
| H03M 1/06 | (2006.01) | |
| H02H 9/04 | (2006.01) | |
| H03M 1/12 | (2006.01) | |
| H03K 17/082 | (2006.01) | |
| H03M 3/00 | (2006.01) | |

(52) U.S. Cl.
CPC ............... *H03M 1/06* (2013.01); *H02H 9/04* (2013.01); *H03K 17/0822* (2013.01); *H03M 1/129* (2013.01); *H03M 3/322* (2013.01); *H03M 3/458* (2013.01)

(58) Field of Classification Search
CPC ........ H03M 1/06; H03M 1/129; H03M 3/322; H03M 3/458; H03K 17/0822
USPC .................. 341/118, 143, 155, 161
See application file for complete search history.

(56) References Cited

U.S. PATENT DOCUMENTS

| | | | | |
|---|---|---|---|---|
| 7,573,413 B2* | 8/2009 | Lee | ..................... | H03K 17/063 341/155 |
| 8,638,156 B2* | 1/2014 | Shibata | ............ | H03K 3/356104 327/308 |
| 2013/0033291 A1 | 2/2013 | Shibata et al. | | |

OTHER PUBLICATIONS

Muhammed Bolatkale et al., A 4GHz CT ΔΣ ADC with 70dB DR and -74dBFS THD in 125MHz BW, ISSCC 2011 / Session 27 / Oversampling Converters / 27.1, 2011 IEEE International Solid-State Circuits Conference, 978-1-61284-302-5/11 © 2011 IEEE, 3 pages.

Hajime Shibata et al., A DC-to-1 GHz Tunable RF ΔΣ ADC Achieving DR= 74 dB and BW= 150 MHz at ƒ0 = 450 MHz Using 550 mW, © 2012 IEEE, 10 pages.

Yunzhi Dong et al., A 235mW CT 0-3 Mash ADC Achieving -167dBFS/Hz NSD with 53MHz BW, ISSCC 2014 / Session 29 / Data Converters for Wireless Systems / 29.2, © 2014 IEEE International Solid-State Circuits Conference, 3 pages.

(Continued)

*Primary Examiner* — Khai M Nguyen
(74) *Attorney, Agent, or Firm* — Patent Capital Group

(57) ABSTRACT

Continuous-time analog-to-digital converters (ADCs) such as continuous-time delta-sigma ADCs and continuous-time pipeline ADCs, has input resistor structure at the input. The input resistor structure is typically tunable, and the tunability is usually provided by metal-oxide semiconductor field effect transistor (MOSFET) switches. Core MOSFETs, which has a terminal-to-terminal voltage <1.0V, is used for the switches for performance reasons. However, a typical implementation can have reliability issues with overloading inputs. An improved input resistor protection circuit can solve this issue by generating on and off voltages for the switches inside the tunable resistor structure based on a summing node voltage where one side of the switch is connected.

20 Claims, 12 Drawing Sheets

(56) References Cited

OTHER PUBLICATIONS

Do-Yeon Yoon et al., An 85dB-DR 74.6dB-SNDR 50MHz-BW CT MASH ΔΣ Modulator in 28nm CMOS, ISSCC 2015 / Session 15 / Data-Converter Techniques / 15.1, 2015 IEEE International Solid State Circuits Conference © 2015 IEEE, 3 pages.
Andrew M. Abo et al., A 1.5-V, 10-bit, 14.3 MS/s CMOS Pipeline Analog-to-Digital Converter, IEEE Journal of Solid-State Circuits, vol. 34, No. 5, May 1999, 8 pages.
Ayman Fayed et al., An Adaptive High-Voltage Protection and Common-Mode Adjustment Circuit for Passive-Active Continuous-Time Sigma-Delta ADCs, Analog Integr Circ Sig Process (2010) 62:159-166, Published online Jun. 23, 2009, 8 pages.
Umesh Jayamohan, RF-Sampling ADC Input Protection: Not Black Magic After All, Analog Dialogue 49-04, Apr. 2015, 5 pages.
Robert C. Taft et al., A 1.8-V 1.6-Gsample/S 8-b Self-Calibrating Folding ADC with 7.26 ENOB at Nyquist Frequency, IEEE Journal of Solid-State Circuits, vol. 39, No. 12, Dec. 2004, 9 pages.

\* cited by examiner

PROTECTION CIRCUITS FOR TUNABLE RESISTOR AT CONTINUOUS-TIME ADC INPUT

PRIORITY DATA

This is a non-provisional patent application receiving benefit from U.S. Provisional Patent Application, entitled, PROTECTION CIRCUITS FOR TUNABLE RESISTOR AT CONTINOUS-TIME ADC INPUT (filed on Dec. 18, 2015, Ser. No. 62/269,528). The US Provisional Patent Application is hereby incorporated by reference in its entirety.

TECHNICAL FIELD OF THE DISCLOSURE

The present disclosure relates generally to analog-to-digital converters (ADCs) and, more particularly, to protection circuits for tunable resistors at continuous-time analog-to-digital converter input.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 11 is a flow diagram illustrating a method for protecting a tunable resistor at the input of a CT ADC, according to some embodiments of the disclosure.

DESCRIPTION OF EXAMPLE EMBODIMENTS OF THE DISCLOSURE

Continuous-time analog-to-digital converters (ADCs) such as continuous-time delta-sigma ADCs and continuous-time pipeline ADCs, has input resistor structure at the input. The input resistor structure is typically tunable, and the tunability is usually provided by metal-oxide semiconductor field effect transistor (MOSFET) switches. Core MOSFETs, which has a terminal-to-terminal voltage<1.0V, is used for the switches for performance reasons. However, a typical implementation can have reliability issues with overloading inputs. An improved input resistor protection circuit can solve this issue by generating on and off voltages for the switches inside the tunable resistor structure based on a summing node voltage where one side of the switch is connected.

Designing Analog-to-Digital Converters

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
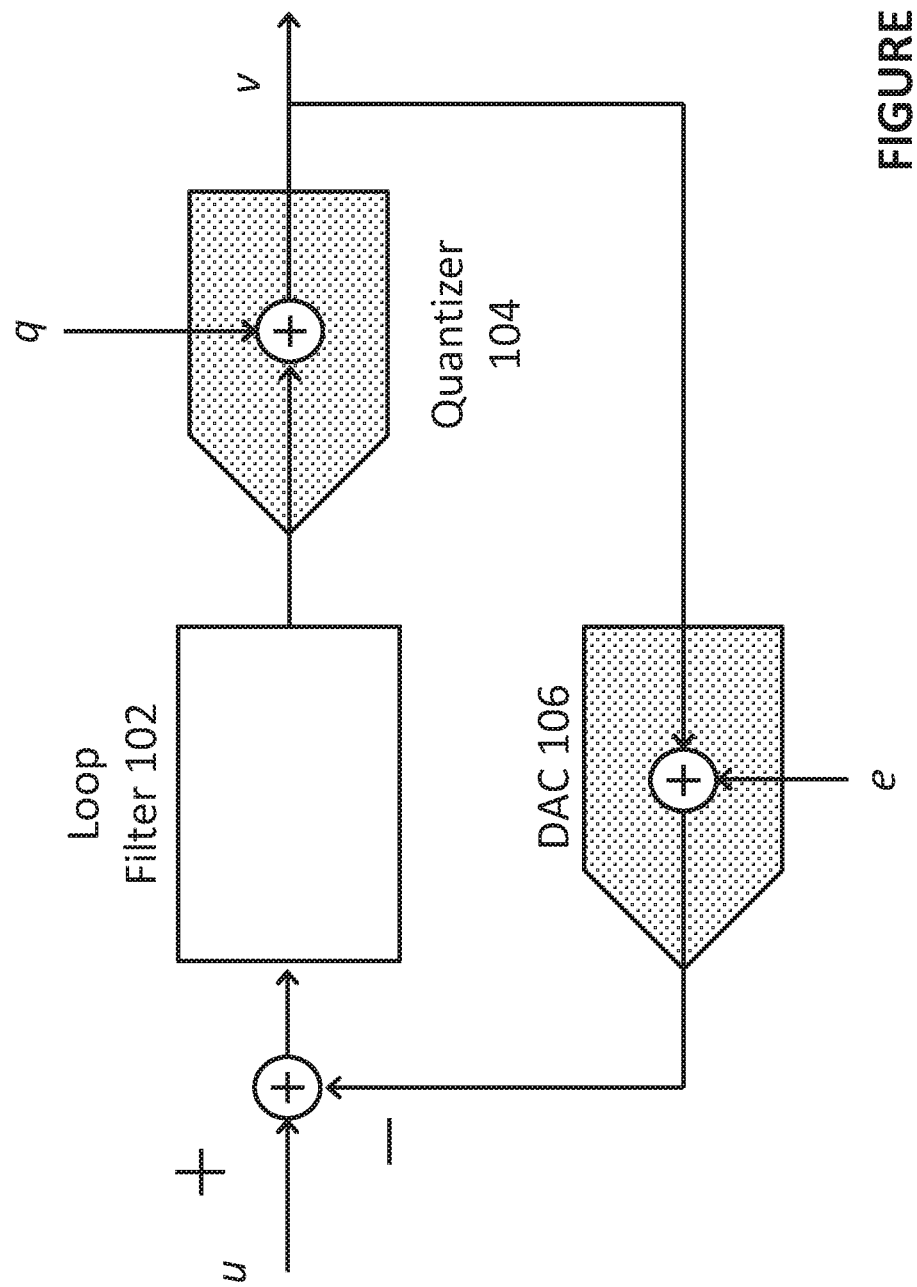
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

Continuous-Time Multi-Stage Noise Shaping Analog-to-Digital Converters (MASH ADCs)

Figure 2:
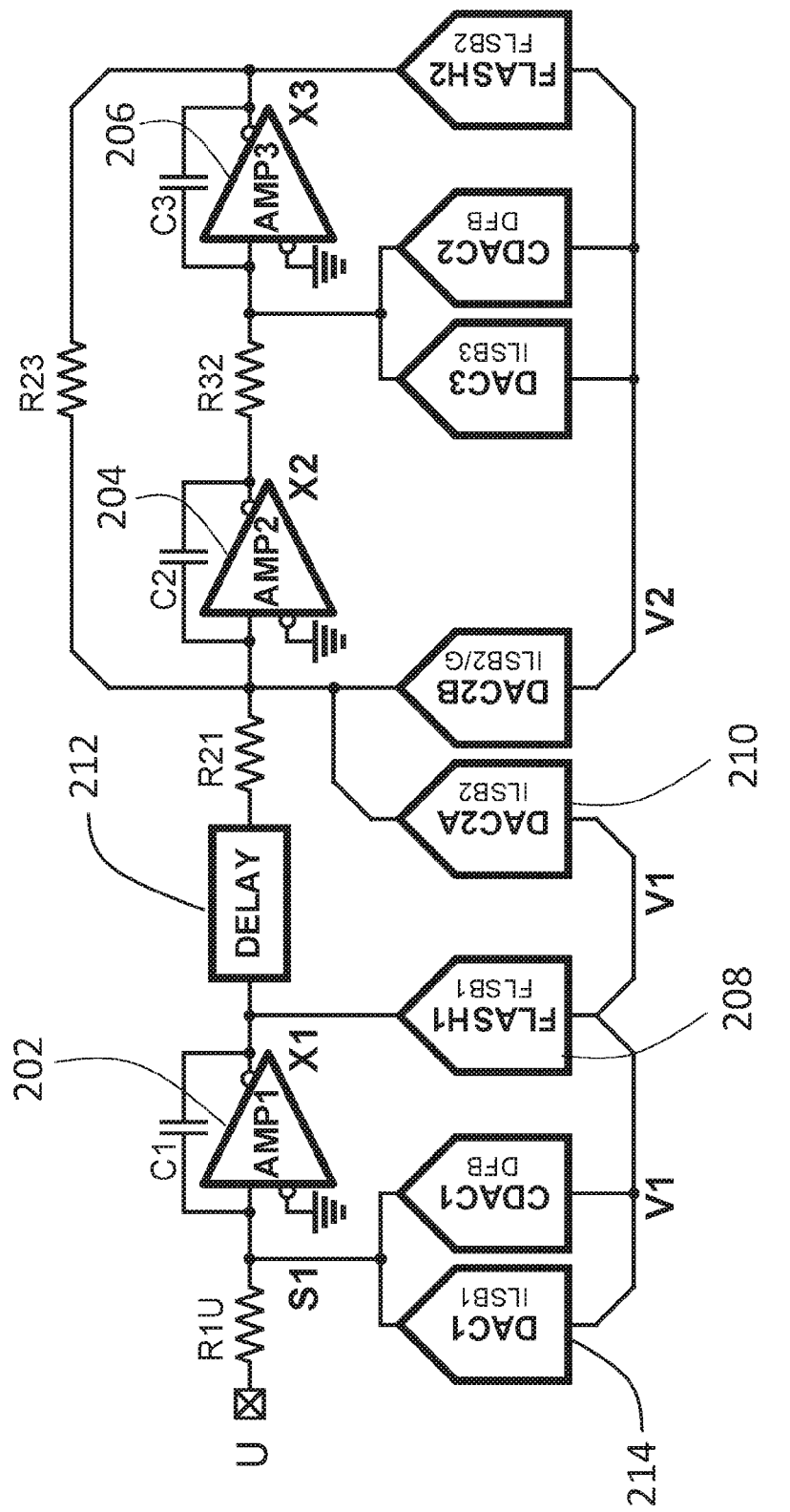
FIG. 2 is an illustrative system diagram of a 1-2 continuous time multi-stage noise shaping delta sigma analog-to-digital converter (CT MASH ADC), according to some embodiments of the disclosure.

FIG. 2 is an illustrative system diagram of a 1-2 continuous time multi-stage delta sigma analog-to-digital converter (CT MASH ADC), according to some embodiments of the disclosure. In this example, the CT MASH ADC has two stages: a first order delta sigma modulator as the first stage (or front end), and a second order delta sigma modulator as the second stage (or back end). The first stage (or front end) generates a first digital output V1. The second stage (or back end) generates a second digital output V2. The order of the delta sigma modulator is determined by the number of integrators (number of feedback loops) in the stage. The first stage (front end) has only one integrator (e.g., integrator having opamp AMP1 202 generating output signal X1), thus it is a first order modulator. The second stage (back end) has two integrators (e.g., integrator having amplifier opamp AMP2 204 generating output X2, and integrator having opamp AMP3 206 generating output X3), thus it is a second order modulator.

Referring back to FIG. 2, the residue of the coarse quantization provided by the flash quantizer ("FLASH1" 208) inside the first order front end is fed to the second order back end and gets digitized by the second order back end. The output of the integrator in the first order front end (or input to the flash quantizer FLASH1 208), X1, is digitized by FLASH1 208 to generate digital output V1. Digital output V1 is provided as input to DAC "DAC2A" 210 to generate an analog output signal. The difference between X1 (or a delayed version of X1 at the output of the delay block 212) and the DAC2A 210 analog output yields the residue of the coarse quantization. The delay element 212 can be provided match possible transconductance and group delay of a signal path used for generating the DAC2A 210 analog output, i.e., the path through FLASH1 208 and DAC2A 210. The digital output of the front end V1 and the digital output of the back end V2 are properly combined in digital domain as the final digital word of the 1-2 CT MASH ADC.

While this example is a 1-2 CT MASH ADC, the present disclosure is applicable to a variety of CT MASH ADCs, including ones with more than two stages, ones where order of the stage differs. Continuous-time converters do not have discrete-time circuitry, e.g., switched-capacitor circuits. As a continuous-time converter, the CT MASH ADC can operate with lower power and achieve better wideband performance than its discrete time counterparts. However, CT converters can be more difficult to design, especially when new challenges are present for manufacturing processes of smaller nodes (e.g., 65, and 28 nm processes).

Continuous-Time Pipeline ADCs

Same as MASH ADCs, pipeline ADCs are converters which have multiple converter stages connected in series or in cascade.

Figure 3:
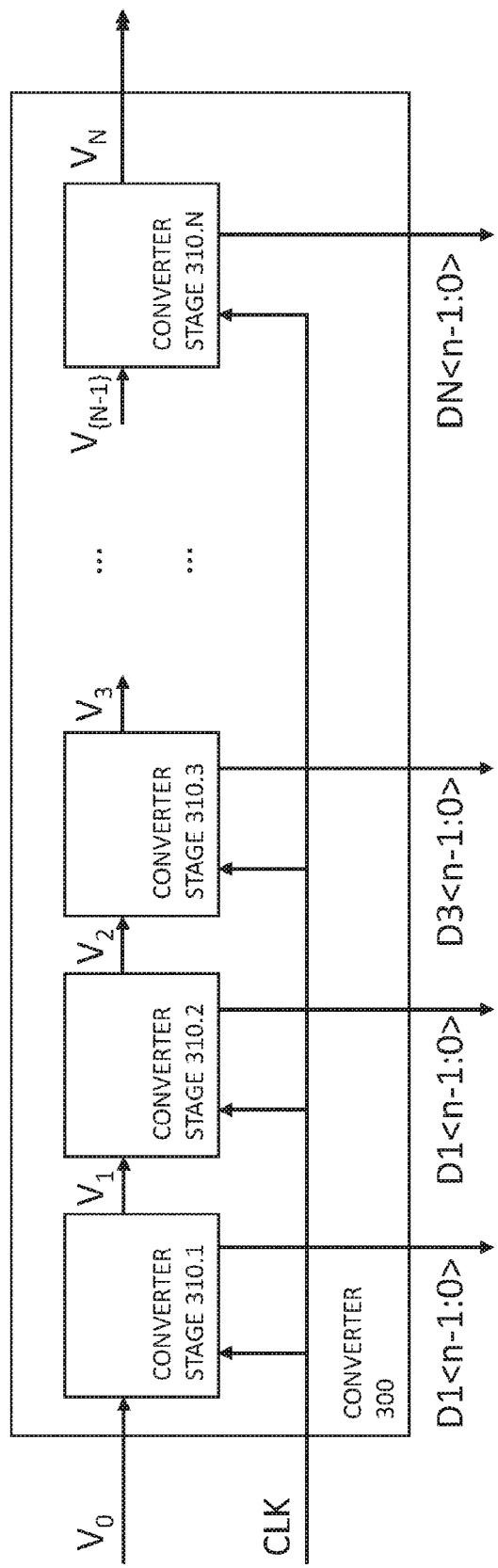
FIG. 3 is an illustrative system diagram of a continuous-time pipeline analog-to-digital converter, according to some embodiments of the disclosure.

FIG. 3 is an illustrative system diagram of a continuous-time pipeline analog-to-digital converter, according to some embodiments of the disclosure. The continuous-time pipeline converter 300 may include a plurality of converter stages 310.1-310.N, connected in series, in pipeline, or in cascade configuration. Each converter stage may receive a clock signal ("CLK") and a respective analog input signal ("$V_0$", "$V_1$", "$V_2$", "$V_3$" . . . "$V_{N-1}$"), and may generate a respective analog (voltage) output signal ("$V_1$", "$V_2$", "$V_3$" . . . "$V_{N-1}$", "$V_N$") and a respective digital output signal ("D1<n-1:0>", "D2<n-1:0>", "D3<n-1:0>" . . . "DN<n-1:0>"). "n" may represent the bit resolution of each converter stage. While it is illustrated in FIG. 1 that all converter stages have the same n number of bits for digital resolution, the converter stages need not have the same number of bits for digital resolution. Each converter stage may generate respective digital output signals, which may be combined to form an overall digital output for the converter 300.

Each converter stage may include an encoder (e.g., coarse ADC) generating the respective digital output signal, a decoder (e.g., a DAC) generating a reconstructed signal, a delaying converter (e.g., a continuous-time delay element) generating a delayed signal from the analog input signal, and an amplifier generating a residue signal (e.g., the amplifier can include a continuous-time integrator), wherein the delayed signal may be a continuous current signal. Each converter stage may generate coarse granularity digital signals based on the analog input signal. Each converter stage also may generate for the next converter stage in the pipeline, a residue signal which is in the continuous-time signal form instead of discrete-time form.

As mentioned previously, continuous-time converters do not have discrete-time circuitry, e.g., switched-capacitor circuits. As a continuous-time converter, the CT pipeline ADC can operate with lower power and achieve better wideband performance than its discrete time counterparts. For instance, a continuous-time pipeline ADC can be capable of wide-bandwidth operation, with a bandwidth of approximate 500 MHz-to-1 GHz with 10 GHz clock frequency, for example for a converter manufactured on a 28 nm CMOS manufacturing process. Similar to CT MASH ADCs, CT pipeline ADCs can be more difficult to design.

Tunable Input Resistor at the Input of a CT ADC

Figure 4A:
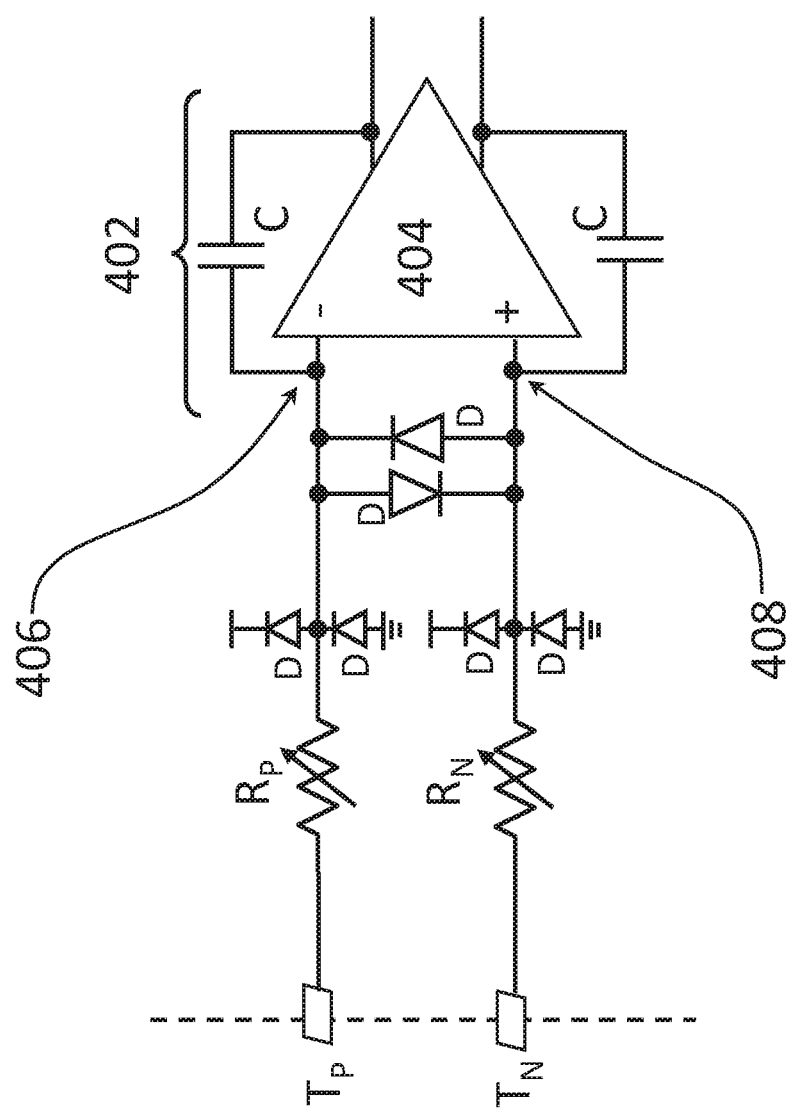
FIG. 4A illustrates a tunable resistor at the input of a continuous time analog-to-digital converter (CT ADC), according to some embodiments of the disclosure.

Usually for CT ADCs (e.g., CT DS ADC, CT MASH ADC, CT Pipeline ADC), the input circuit structure usually has an input resistor. Such input resistor is a typically a tunable resistor to compensate for process variation. FIG. 4A illustrates a tunable resistor at the input of a continuous time analog-to-digital converter (CT ADC), according to some embodiments of the disclosure. The tunable (input) resistor is provided between the input terminal of the CT ADC and the input of the integrator 402 with opamp 404. The integrator 402 is a continuous time integrator, which can have an opamp 404 and at least one capacitor C in a feedback configuration. In the differential implementation shown, there are two tunable resistors $R_P$ and $R_N$. The tunable resistor $R_P$ is connected to input terminal $T_P$, and one of the two input terminals of the integrator 402. The tunable resistor $R_N$ is connected to input terminal $T_N$, and the other one of the two terminals of the integrator 402. The input terminals of the integrator 402 are referred to herein as the opamp summing nodes 406 and 408. Terminals, $T_P$ and $T_N$, are connected to an analog input (e.g., to receive a differential analog input), which can be provided by circuitry outside of the CT ADC (e.g., off-chip).

Due to limitations in the semiconductor manufacturing process, the variation on the resistance values of the input resistors can change 20%-25%. For example, suppose the differential input resistance is 200 Ohms, then each resistor should have a resistance value of 100 Ohms plus or minus 1% or so. The RC value of the integrator governs the transfer function of the converter, and thus the control of the R value is important for the proper operation of the CT ADC. The process variation makes it difficult to accurately implement the resistance value. To address this issue, the resistance values of the input resistors are made tunable.

Figure 4B:
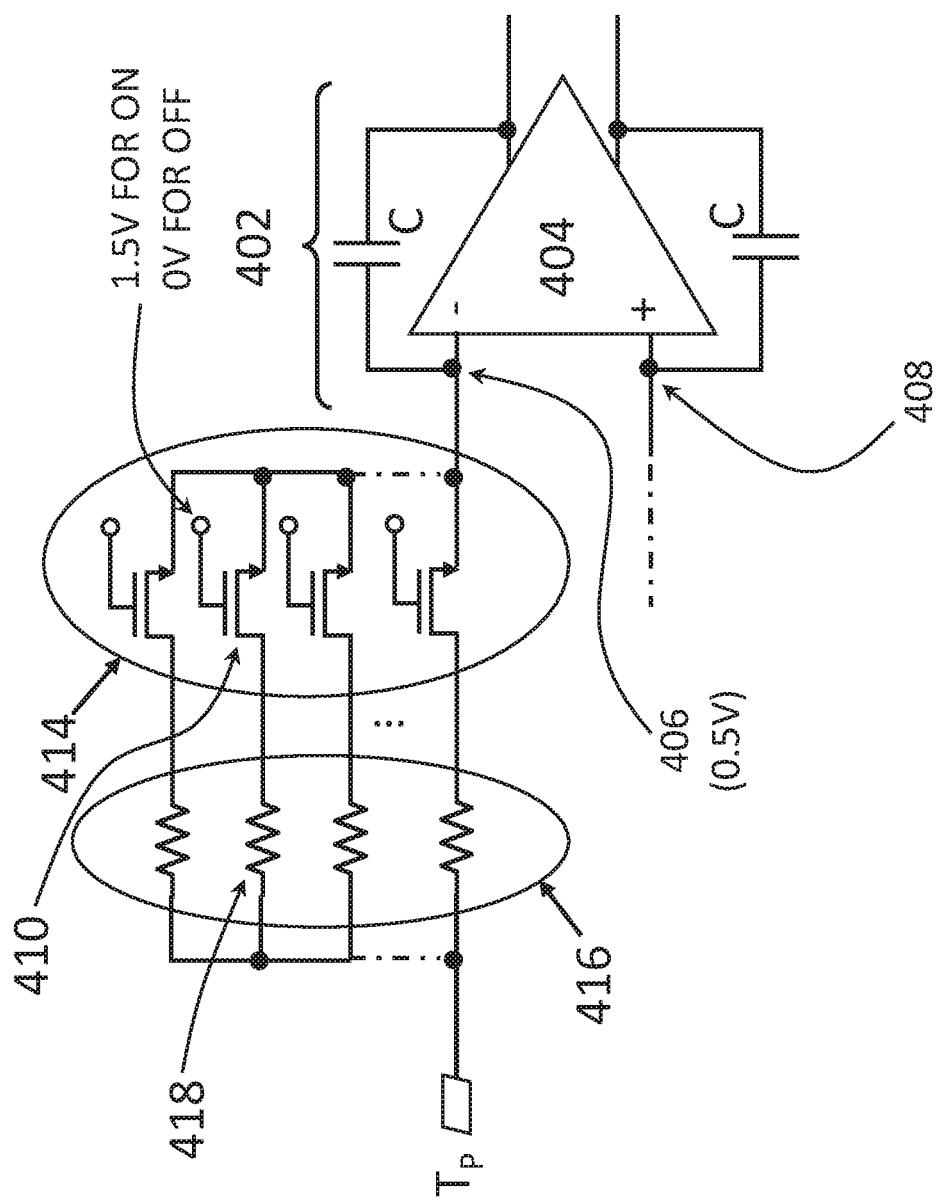
FIG. 4B is a zoomed in view of the input circuit of FIG. 4A, according to some embodiments of the disclosure.

FIG. 4B is a zoomed in view of the input circuit of FIG. 4A, according to some embodiments of the disclosure. The zoomed in view depicts the tunable resistor $R_P$ in greater detail, and one skilled in the art would appreciate that that the tunable resistor $R_N$ can be implemented in a similar fashion. To provide the tunable resistor, a bank of resistor slides 416 are configured in parallel. Switches 414 are provided to switch resistor slices 416 in or out of the tunable resistor to vary the overall resistance of the tunable resistor. To control for process variation and to provide an accurate resistance value R at the input, switches 414 are included to switch parallel resistors slices 416 in or out of the tunable resistor to tune the input resistance value.

The switches 414 can be implemented with metal-oxide semiconductor field-effect transistors (MOSFETs), since they are readily available in complementary metal-oxide semiconductor processes. The operation of switching a resistor in and out is described with respect to one exemplary resistor slice 418 and one exemplary transistor 410. The resistor slice 418 in the bank of resistor slices is connected to an input terminal of the CT ADC (e.g., $T_P$, $T_N$) and the drain of transistor 410 (transistor 410 serving as the switch). The source of the transistor 410 is connected to an input terminal of the integrator 402. The input terminal of the integrator 402 can be referred to herein as an input terminal of the opamp 404 of the integrator 402, opamp summing node 406, or opamp summing node 408. The gate of the transistor 410 is driven by a particular voltage to turn the switch or transistor ON or OFF in order to switch the transistor in or out of the bank of transistors. Phrased differently, one terminal of the switch (e.g., drain of the transistor 410) is connected to a corresponding resistor slice (e.g., resistor slice 418), and another terminal of the switch (e.g., source of the transistor 410) is connected to opamp summing node 406. The state of the switch is controlled by a control voltage (e.g., a control voltage at the gate of the transistor 410).

When the switch is ON, the corresponding resistor slice is selected/used. When the switch is OFF, the corresponding resistor slice is not selected/used. Different types of MOSFETs are available as switches in the tunable resistor, including I/O MOSFETs and core MOSFETs. A specific type of MOSFETs can be used, core MOSFETs (or core CMOS), for switches 404 for performance reasons. For example, core MOSFET can achieve maximum channel conductance $g_{ds}$ with minimum (nonlinear) parasitic capacitances.

However, core MOSFET devices have relatively small terminal-to-terminal voltage. For example, in 65 nm or 28 nm processes, the terminal-to-terminal voltage (e.g., drain to source voltage $V_{DS}$, gate to source voltage $V_{GS}$) has to be less than 1.0 Volts (V). That is, $|V_{GS}|<1V$ and $|V_{DS}|<1V$, to ensure the core MOSFET does not get damaged. Otherwise, higher voltages than the specified terminal-to-terminal voltage would damage the core MOSFET. While I/O MOSFETs having higher terminal-to-terminal voltage tolerance (1.8-2.5V), the use of I/O MOSFET at the ADC input degrades distortion of the ADC due to its nonlinear $g_{ds}$ and parasitic capacitances/resistances. The use of core MOSFET (1.0V) alleviate the distortion issue and improve performance, but the core MOSFETs can be damaged by the overloading inputs (large voltage swing) at the input terminals $T_P$ and $T_N$. When the voltage swing is large, the terminal-to-terminal voltage of the core MOSFETs can easily exceed 1.0 V.

Note that in 65 nm or 28 nm processes, the supply voltage is generally around 1.0 Volts (0.9V-1.2V or so). Accordingly, the input terminals of the integrator 402 (also referred herein as the summing node voltage) is preferably operating at 0.5 Volts, roughly half of the supply voltage (and remains stable at 0.5 V due to the feedback action of the integrator 402 as long as the input is within the normal acceptable range). To turn ON any one of the switches 414, where one terminal of the switch is connected to the opamp summing node, generally 1 V is applied across the source and the gate of the transistor, e.g., the core MOSFET, to have the maximum conductance of the core MOSFET. Therefore, the gate voltage can be set to roughly 1.5 V=0.5 V+1 V (the exact voltage can vary by the process) to turn ON the core MOSFET, and the gate voltage can be set to 0 V to turn OFF the core MOSFET.

Overloading Conditions on the Core MOSFET

For some of the FIGURES, only one switch and one corresponding resistor slice are shown for simplicity. The other switches and resistor slices of the tunable resistor structure (parallel to the switch and resistor slice shown) are omitted for simplicity. It is understood that the overloading conditions are applicable to the other switches and resistor slices in the same manner. Voltages used in describing the conditions on the MOSFET are meant to be illustrative and not limiting to the disclosure.

Figure 5:
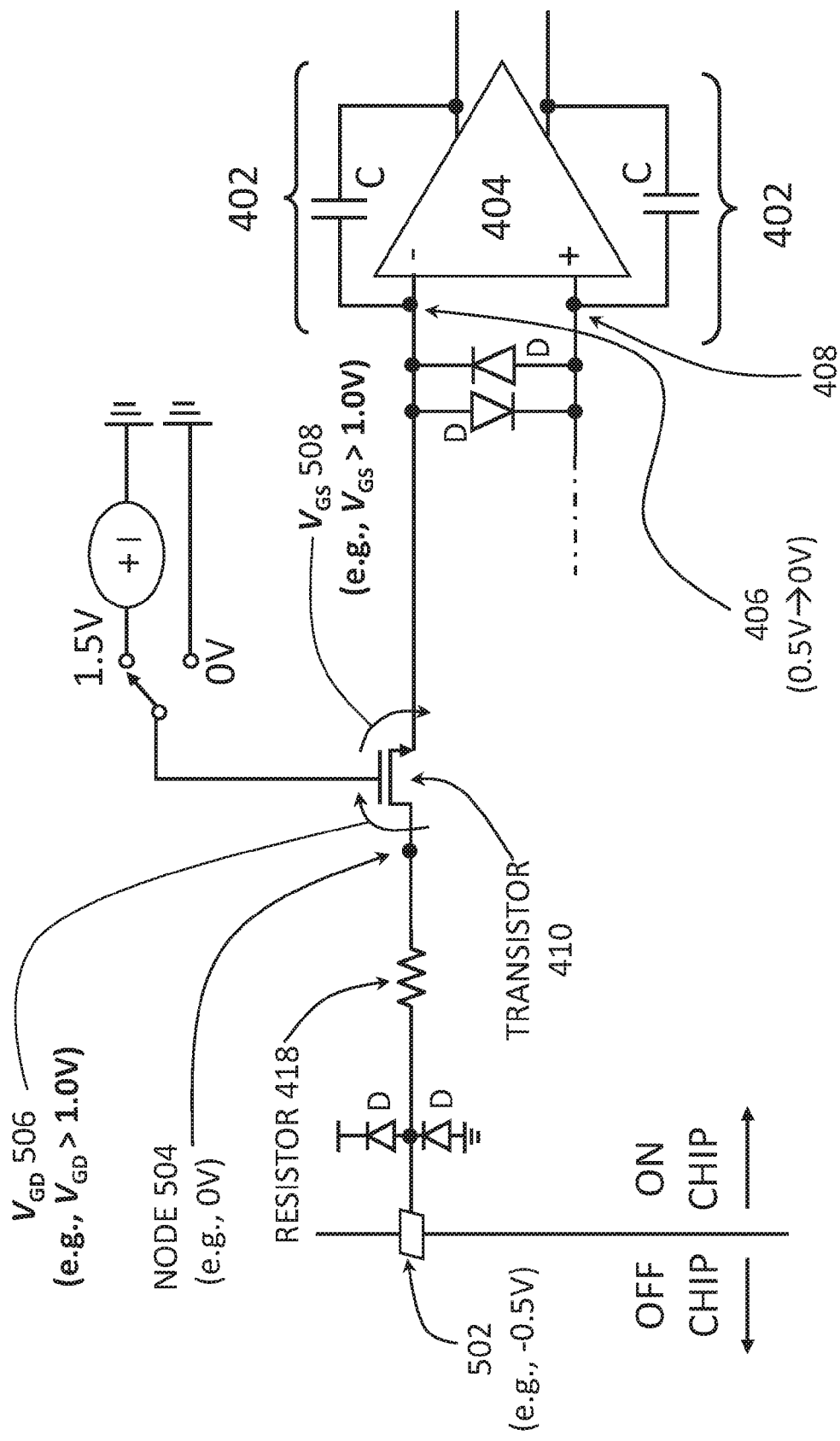
FIG. 5 illustrates an example of an overload condition.

FIG. 5 illustrates an example of an overload condition. To illustrate, one resistor (slice) 502, and one transistor 504 for switching the resistor 502 in or out is shown. Resistor 418 is connected to an input terminal 502 of the CT ADC and the drain of transistor 410 (transistor 410 serving as the switch). Resistor 418 is example of one resistor slice of resistor slices 416 of FIG. 4B. Transistor 410 is an example of one transistor of switches 414 of FIG. 4B. Referring back to FIG. 5, the source of the transistor 410 is connected to an input terminal of the integrator 402, e.g., opamp summing node 406, and opamp summing node 408 (if the resistor 418 and transistor 410 is in the other differential signaling path).

In this example, the transistor 410 is a core MOSFET. To turn ON the core MOSFET, 1.5 V is being applied at the gate of the core MOSFET. Suppose the input range is normally centered at 0.5 V, ranging from 0 V to 1 V. When the input is overloaded, the input voltage at the input terminal 502 can fall below 0 V. In this example, the input voltage is -0.5 V at the input terminal 502. After an IR drop, i.e., voltage drop, across the resistor 418, the voltage at the drain of the transistor 410, or node 504 can be 0 V. In such a scenario, the gate to drain voltage $V_{GD}$ 506 of transistor 410 (i.e., voltage across node 504 and the gate of transistor 410) is 1.5 V, which is greater than the 1 V terminal-to-terminal voltage of the core MOSFET. The core MOSFET can be damaged. The same can occur on the gate to source side, where the voltage at the opamp summing node 406 voltage (at the input terminal of the integrator 402) goes from 0.5 V to 0 V due to the input being at -0.5 V. The gate to source voltage $V_{GS}$ 508 (i.e., voltage across the gate of transistor 410 and opamp summing node 406) is 1.5 V, which is also greater than the 1 V terminal-to-terminal voltage of the core MOSFET. Accordingly, when the voltage at the input terminal 502 falls below 0 V and the core MOSFET (i.e., transistor 410) is being turned ON, the core MOSFET can break.

Figure 6:
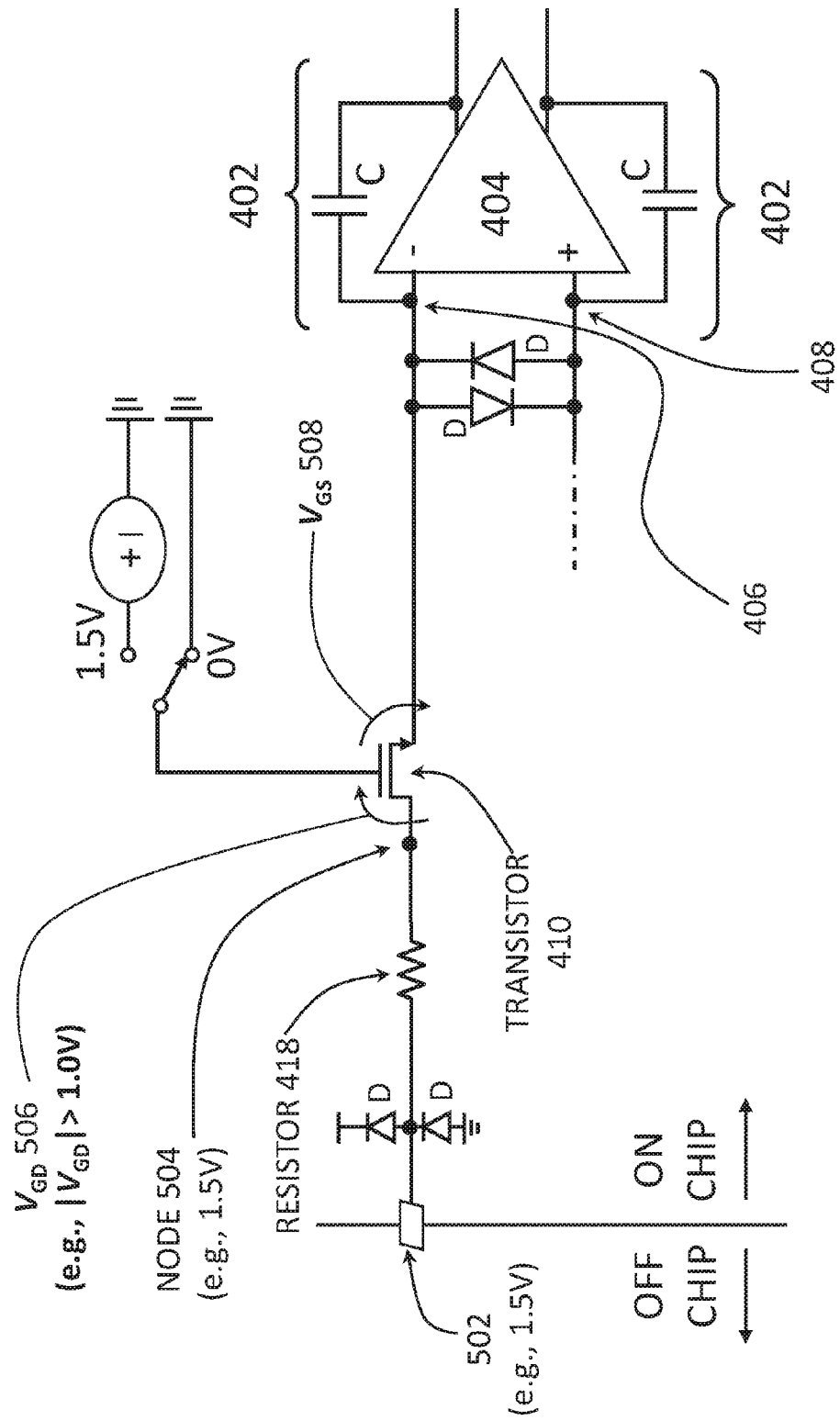
FIG. 6 illustrates another example of an overload condition.

FIG. 6 illustrates another example of an overload condition. In this example, the transistor 410 is a core MOSFET. To turn OFF the core MOSFET, 0 V is being applied at the gate of the core MOSFET. Suppose the input range is normally centered at 0.5 V, ranging from 0 V to 1 V. When the input is overloaded, the input voltage at the input terminal 502 can go above 1 V. In this example, the input voltage is 1.5V at the input terminal 502. Since the core MOSFET is turned OFF and not conducting current, there is no IR drop across the resistor 518, and the voltage from the input terminal 502 appears as 1.5 V at the drain of the core MOSFET or node 504. In such a scenario, the gate to drain voltage $V_{SD}$ 506 (i.e., voltage across node 504 and the gate of transistor 410) is -1.5 V, whose absolute value or magnitude is greater than the 1 V terminal-to-terminal voltage of the core MOSFET (i.e., $|V_{GD}|>1.0V$). In this example, the core MOSFET can be damaged. Accordingly, when the voltage at the input terminal 602 is above 1 V and the core MOSFET is being turned OFF, the core MOSFET can break.

While I/O transistors can be used in place of core MOSFETs to have higher maximum allowable terminal-to-terminal voltage and reduce the chance of the switch or MOSFET being damaged, the distortions introduced by the I/O transistors were unacceptable for certain applications. In general, the diodes (labeled as "D" in the FIGURES) being provided at the input terminal 502 can clamp the input voltage to a certain extent. However, these diodes can be insufficient for protecting the core MOSFET due to a much smaller maximum allowable terminal-to-terminal voltage of the core MOSFET. While some examples herein describes challenges with using core MOSFETs, it is understood by one skilled in the art that the embodiments described herein are applicable to implementations where the transistors may breakdown easily due to a relatively low maximum allowable terminal-to-terminal voltage.

Protection Circuit for the Tunable Resistors

To address the overloading conditions described above, rather than providing a fixed reference voltage of 1.5 V and 0 V at the gate of the core MOSFET to turn the core MOSFET ON or OFF (respectively), the voltage driving the gate of the core MOSFET is generated based on the voltage at the opamp summing node (e.g., opamp summing node 406 or 408) or an input terminal of the integrator 402. This voltage is referred herein as the summing node voltage (which is normally at 0.5 V as an example).

Figure 7:
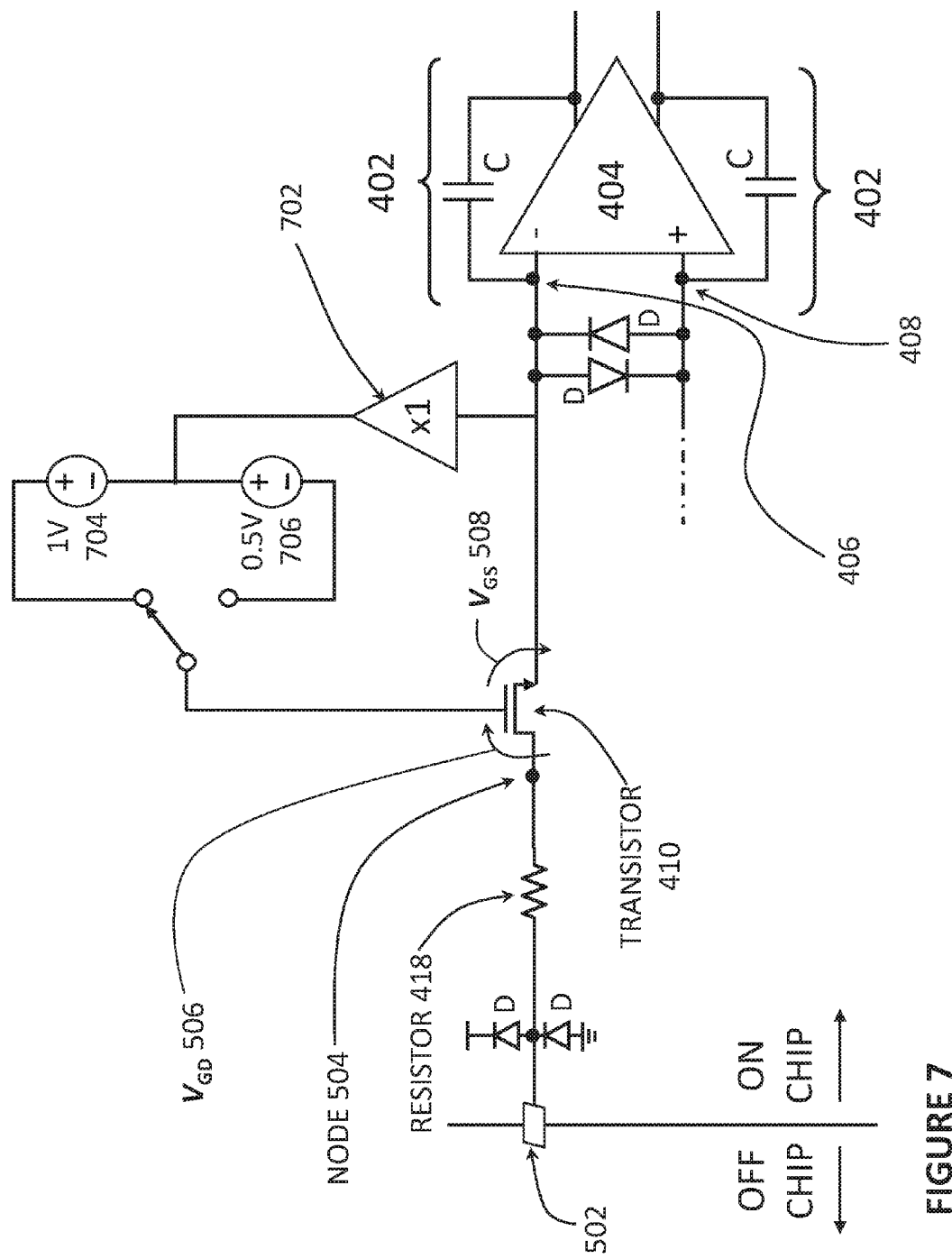
FIG. 7 shows an exemplary protection circuit for the tunable resistor at the input of a CT ADC.

FIG. 7 shows an exemplary protection circuit for the tunable resistor at the input of a CT ADC. The voltage at opamp summing node 406 (as an example) is provided to voltage generators 704 and 706 (shown as 1 V and 0.5 V voltage sources), e.g., via a unit gain (x1) buffer 702. The voltage generators 704 and 706 are connected to the opamp summing node 406 to generate the ON and OFF voltages to be applied to the gate of the core MOSFET. The ON and OFF voltages, accordingly, follow the opamp summing node 406 voltage. When overloading occurs at the ADC input (e.g., at input terminal 502), the voltage at opamp summing node 406 (voltage at the input terminal of integrator 402) deviates from the normal voltage of 0.5 V. The transistor 410 (e.g., a core MOSFET) can be protected by generating the gate voltage of the transistor 410 based on the deviated opamp summing node voltage to avoid exceeding the terminal-to-terminal voltage of the transistor 410. Phrased differently, the ON and OFF voltages for switches inside a tunable resistor structures are generated based on the summing node voltage (e.g., opamp summing node 406, opamp summing node 408, or input terminal of the integrator 402) to which one side of the switch (e.g., the source) is connected (the other side of the switch, e.g., the drain, is connected to the resistor slice). The summing node voltage is kept constant (e.g., 0.5 V) when the input voltage is within the normal range. The summing node voltage can deviate from the normal operating point if the input is overloaded. In either case, the protection circuit ensures the terminal-to-terminal voltage requirement is met.

The ON and OFF voltages are generated by a DC voltage shift (provided by voltage generators 704 and 706, or source followers) and buffering (by buffer 702). As explained previously, a resistor slice connects between the ADC input terminal and the switch. The protection circuit can ensure the core MOSFET as the switch can still operate even when the allowable terminal-to-terminal voltage of the core MOSFET is relatively small. The protection circuit for the tunable resistor can be particularly useful at the input of the continuous-time DS ADCs, continuous-time MASH ADCs and continuous-time pipeline ADCs, where the switches being used in the tunable resistor circuit needed to meet application requirements (i.e., distortion levels) can have relatively low maximum allowable terminal-to-terminal voltage.

Figure 8:
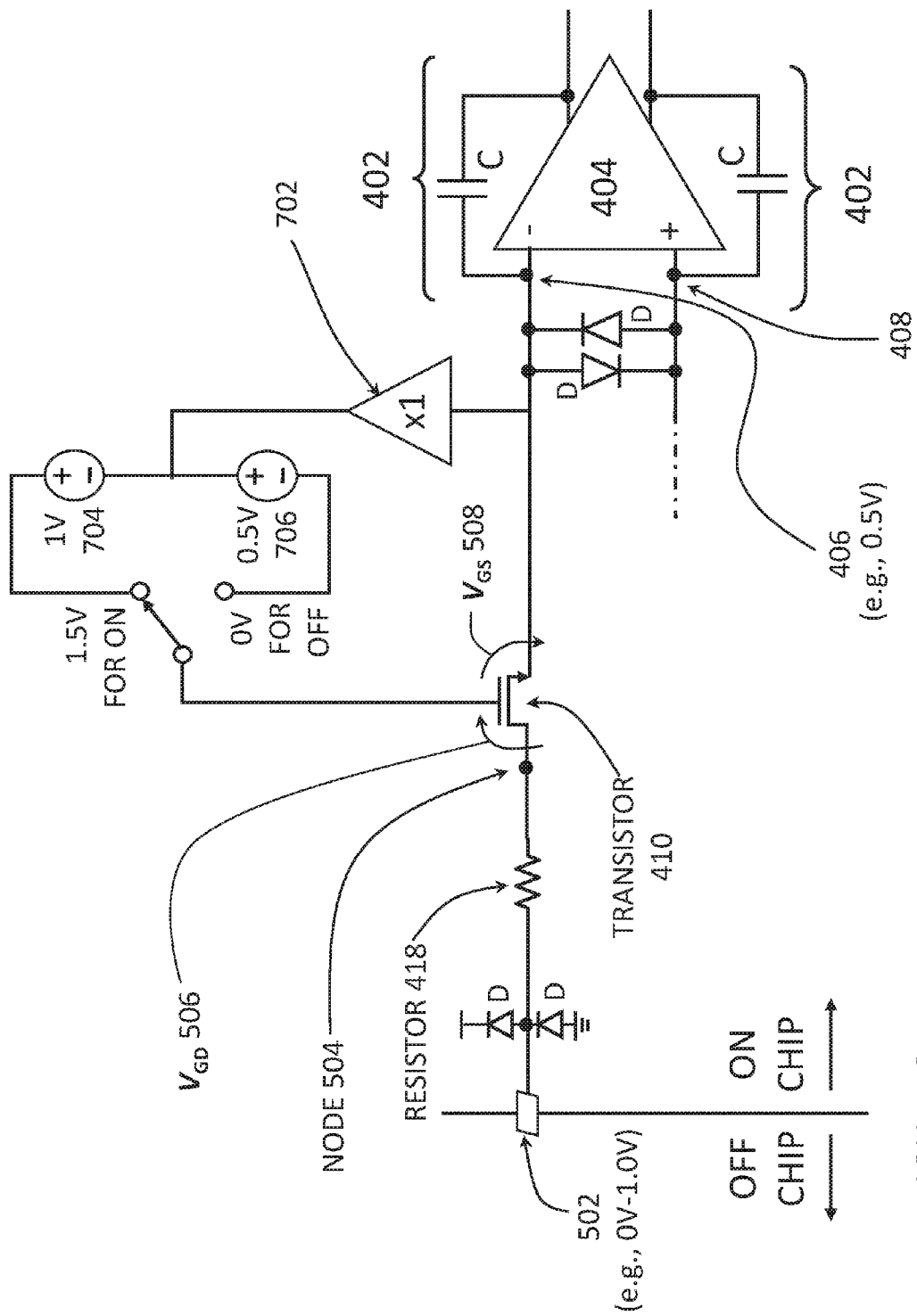
FIG. 8 shows the exemplary protection circuit for the tunable resistor at the input of a CT ADC under a normal condition.

FIG. 8 shows the exemplary protection circuit for the tunable resistor at the input of a CT ADC under a normal condition. During the normal condition, the input signal at terminal 502 is within the normal range from 0 V to 1.0 V, the voltage at opamp summing node 406 is 0.5 Volts. The feedback action of the integrator 402 keeps the voltage at the opamp summing node 406 more or less constant at 0.5 Volts. Accordingly, the ON and OFF voltages (1.5 V and 0 V respectively) can be generated by the voltage shifts/generators 704 and 706 to drive the gate of the transistor 410 (core MOSFET) ON or OFF. The ON voltage of 1.5 V is generated based on the voltage at the opamp summing node 406 of 0.5 V plus the voltage shift of voltage generator 704 of 1 V. The OFF voltage of 0 V is generated based on the voltage at the opamp summing node 406 of 0.5 V minus the voltage shift of voltage generator 706 of 0.5 V. The transistor 410 core MOSFET is not damaged since the terminal-to-terminal voltage conditions (e.g., $V_{GD}$ 506 and $V_{GS}$ 508) have not exceeded 1 V, and the ON and OFF switching of the transistor 410 operates properly.

When the input signal is beyond the normal range, e.g., 0 V to 1.0 V, the voltage at the opamp summing node can deviate from 0.5 V because the feedback action of the integrator 402 runs out. The voltage at the opamp summing node 406 thus can go up or down from 0.5 V depending on the input signal at input terminal 502. Phrased differently the feedback action of the integrator 402 is saturated and the voltage at the opamp summing node 406 is greatly affected by the input voltage. For instance, if the input signal at 1.5 V, the voltage at the opamp summing node 406 can go from 0.5 V to 1.0 V. If the input signal is at −0.5 V, the voltage at the opamp summing node 406 can go from 0.5 V to 0 V. While the diodes (labeled as "D" in the FIGURES) at the inputs of the integrator 402 can clamp the voltage at the opamp summing nodes 406 from 0 V to 1 V, the voltage at the opamp summing node 406 can still deviate from the 0.5 V operating point.

Figure 9:
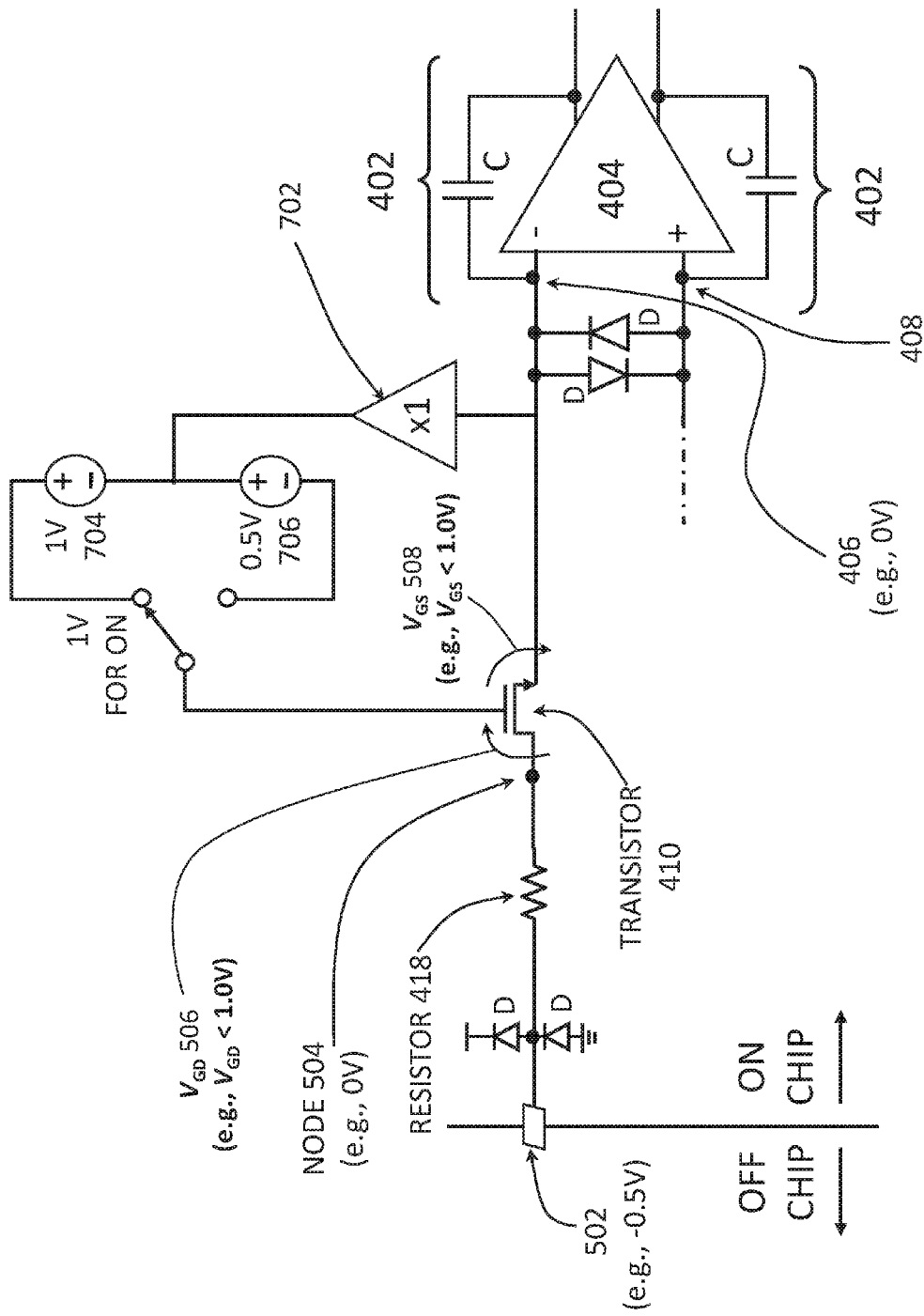
FIG. 9 shows the exemplary protection circuit for the tunable resistor at the input of a CT ADC under an overload condition.

FIG. 9 shows the exemplary protection circuit for the tunable resistor at the input of a CT ADC under an overload condition (negative overload). In this example, the transistor 410 (e.g. core MOSFET) is to be turned ON, so the gate of the core MOSFET is being connected to the voltage generator 704 providing a voltage shift of 1 V (up) from the voltage at the opamp summing node 406. Suppose the input range is normally centered at 0.5 V, ranging from 0 V to 1 V. When the input is overloaded, the input voltage at the input terminal 502 can fall below 0 V. In this example, the input voltage is −0.5 V at the input terminal 502. After an IR drop, i.e., voltage drop, across the resistor 418, the voltage at the drain of the transistor 410 (node 504) can be 0 V. The voltage at the opamp summing node 406 deviates from 0.5 V to 0 V. Accordingly, 1 V (0 V at the opamp summing node 406 shifted by 1 V voltage shift up) is applied to the gate of the core MOSFET. In such a scenario, the gate to drain voltage $V_{GD}$ 506 is roughly 1 V, meaning the 1 V terminal-to-terminal voltage requirement of the core MOSFET can be met ($V_{GD}$<1.0V). Also, the gate to source voltage $V_{GS}$ 508 also is roughly 1.0 V, also meaning the 1 V terminal-to-terminal voltage requirement of the core MOSFET can be met ($V_{GS}$<1.0V). The transistor 410 (core MOSFET) is protected from damage. Accordingly, when the voltage at the input terminal 502 falls below 0 V and the core MOSFET is being turned ON, the transistor 410 (e.g., core MOSFET) in the tunable resistor is protected by the protection circuit.

Figure 10:
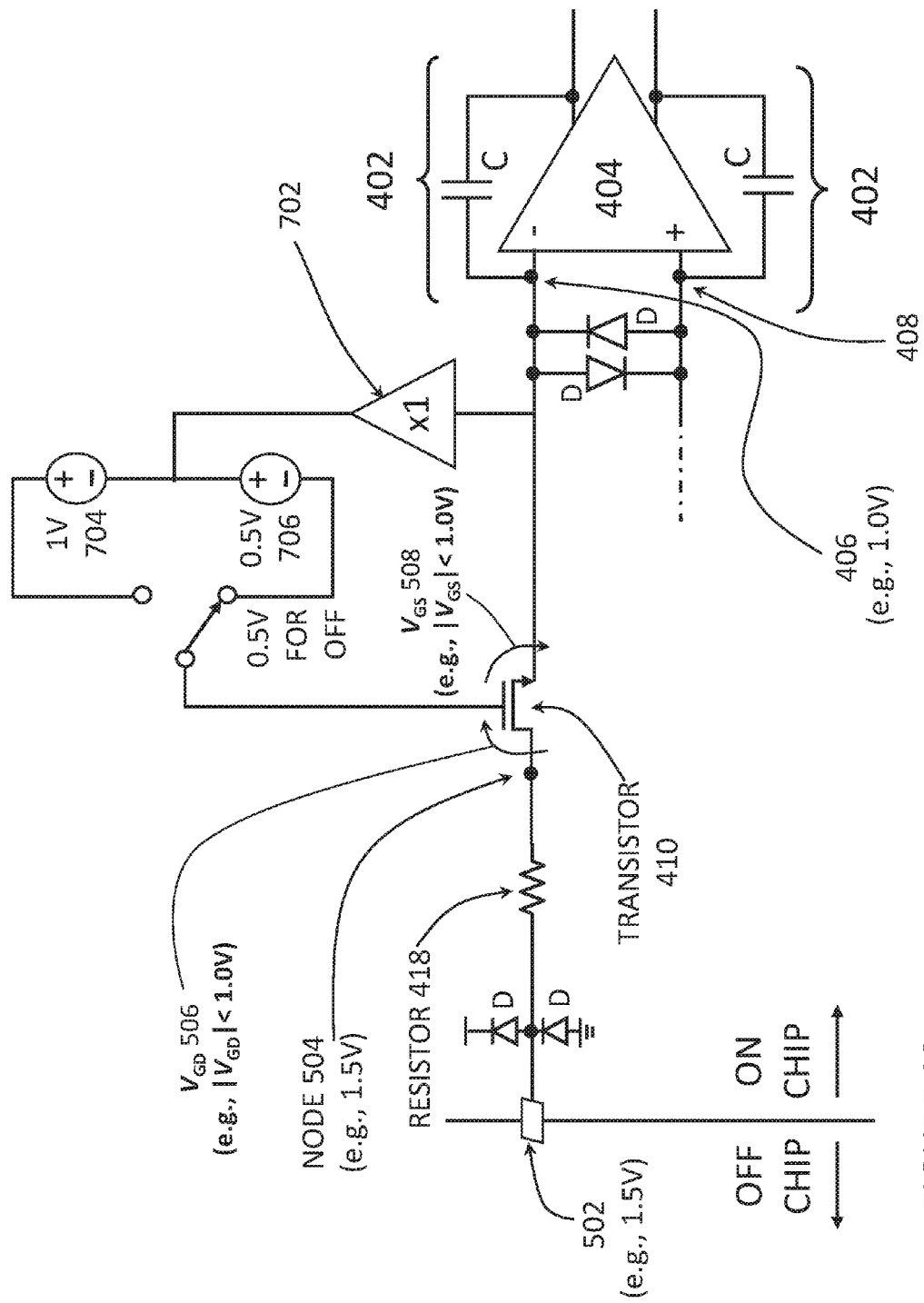
FIG. 10 shows the exemplary protection circuit for the tunable resistor at the input of a CT ADC under another overload condition.

FIG. 10 shows the exemplary protection circuit for the tunable resistor at the input of a CT ADC under another overload condition (positive overload). In this example, the transistor 410 (e.g., core MOSFET) is to be turned OFF, so the gate of the transistor 412 is being connected to the voltage generator 704 providing a voltage shift of 0.5 V (down) from the voltage at the opamp summing node 406. Suppose the input range is normally centered at 0.5 V, ranging from 0 V to 1 V. When the input is overloaded, the input voltage at the input terminal 502 goes above 1 V. In this example, the input voltage is 1.5 V at the input terminal 502. Since the transistor 410 (core MOSFET) is turned OFF and not conducting current, there is no IR drop across the resistor 418, and the voltage from the input terminal 502 appears as 1.5 V at the drain of the transistor 410 (node 504). The voltage at the opamp summing node 406 deviates from 0.5 V to 1 V. Accordingly, 0.5 V (1 V at the summing node shifted by 0.5 V voltage shift down) is applied to the gate of the transistor 410 In such a scenario, the gate to drain voltage $V_{GD}$ 506 is roughly −1 V, meaning the 1 V terminal-to-terminal voltage requirement of the core MOSFET can be met ($|V_{GD}|$<1.0V). The gate to source voltage $V_{GS}$ 508 is roughly −0.5V, meaning the 1 V terminal-to-terminal voltage requirement of the core MOSFET can be met ($|V_{GS}|$<1.0V) as well. In this example, the transistor 410 (core MOSFET) is protected from damage. Accordingly, when the voltage at the input terminal 502 is above 1 V and the transistor 410 (e.g., core MOSFET) is being turned OFF, the transistor 410 is protected by the protection circuit.

For FIGS. 7-10 herein, only one switch/transistor and one corresponding resistor slice are shown for simplicity. The other switches and resistor slices of the tunable resistor structure (parallel to the switch and resistor slice shown) envisioned by the disclosure are omitted for simplicity. It is understood that the protection circuit can be replicated for the other switches and resistor slices in the same manner. The tunable resistor structure having the protection circuit for every resistor slice can be implemented for both differential paths of the circuit, even though only one switchable resistor slice is shown for one differential path.

For a differentially overloaded signal (not referring to common mode overloaded inputs), when the overload condition occurs on one differential path (e.g., say one input terminal sees −0.5V), the opposite overload condition occurs in the other differential path (e.g., the other input terminal sees +1.5V). Accordingly, protection circuits implemented in both paths can protect the core MOSFETs on both sides of the differential circuit. The other tunable resistor structure for the other differential path is omitted in the FIGURES herein for simplicity.

Voltages used in describing the conditions on the MOSFET are meant to be illustrative and not limiting to the disclosure, as actual voltages can deviate by 0.1-0.2 V for some of the voltages shown in the FIGURES.

Method for Protecting a Tunable Resistor at the Input of a CT ADC

FIG. 11 is a flow diagram illustrating a method for protecting a tunable resistor circuit at the input of a CT ADC, according to some embodiments of the disclosure.

In 1102, an ON voltage is generated based on a first DC voltage shift on the summing node voltage. For instance, the first DC voltage shift can be +1V. The ON voltage is thus the summing node voltage plus 1 V. In 1104, an OFF voltage is generated based on a second DC voltage shift on the summing node voltage. For instance, the second DC voltage shift can be −0.5V. The OFF voltage is thus the summing node voltage minus 0.5V. In 1106, the gate of the core MOSFET is driven by either the ON or the OFF voltage, depending on the desired resistor value of the tunable resistor.

For 1102 and 1104, the method can include generating a first voltage and a second voltage based on a voltage at a summing node of an operational amplifier of the ADC. For 1106, the method can include driving a transistor coupled to a resistor slice of the tunable resistor circuit with the first voltage to switch in the resistor slice, and driving the transistor with the second voltage to switch out the resistor slice. The transistor is coupled to the summing node and the resistor slice is coupled to an input terminal of the ADC and the transistor (see e.g., FIGS. 7-10). Switching the resistor slice in and out adjusts an overall resistance of the tunable resistor. For a CT ADC, controlling the value of the resistance is useful for controlling the transfer function of the CT ADC.

The input to the ADC can sometimes be positively overloaded or negatively overloaded. The voltage at the summing node deviates in response to an overload condition at the input of the ADC. The deviation of the voltage at the summing node to which one terminal of the transistor is connected can stress the transistor if the gate is not driven properly. To address this issue, the first voltage and the second voltage usable for driving the gate of the transistor can follow the voltage at the summing node to limit gate to drain voltage and gate to source voltage of the transistor. The risk of damaging the transistor is accordingly reduced.

For 1102, generating the first voltage (ON voltage) comprises shifting the voltage at the summing node by a first DC voltage shift. Driving the transistor with the first voltage turns on the transistor. In some embodiments, generating the first voltage comprises up shifting the voltage at the summing node up by a first voltage shift. For 1104, generating the second voltage (OFF voltage) comprises shifting the voltage at the summing node by a second DC voltage shift. Driving the transistor with the second voltage turns off the transistor. In some embodiments, generating the second voltage comprises down shifting the voltage at the summing node down by a second voltage shift. Voltage generators seen in FIGS. 7-10 can be included for implementing 1102 and 1104. It is understood that the on or off voltages and the amount of voltage shift can differ depending on transistor and the circuit implementation of the tunable resistor circuit.

Exemplary Tunable Resistor Circuits and Protection Circuits for the Tunable Resistor Circuits In some embodiments, tunable resistor circuit at an input of an analog-to-digital converter (ADC) includes resistor slices, transistors, and drivers. The tunable resistor circuit are illustrated by FIGS. 7-10. The resistor slices are configured in parallel coupled to an input terminal of the ADC. The transistors are coupled to respective resistor slices and a summing node of an operational amplifier of the ADC for switching the resistor slices in and out of the tunable resistor circuit. The drivers are coupled to respective transistors for generating on and off voltages for the transistors from a voltage at the summing node. As illustrated by the examples in FIGS. 7-10, a first resistor slice of the resistor slices is coupled to a drain of a first transistor of the transistors, a source of the first transistor of the transistor is coupled to the summing node, and a gate of the first transistor is coupled to a first driver of the drivers.

The on voltage turns on a first transistor of the transistors and switches a first resistor slice of the resistor slices in, and the off voltage turns off the first transistor and switches the first resistor slice out. In some embodiments, the on voltage is the voltage at the summing node plus a first voltage shift, the off voltage is the voltage at the summing node minus a second voltage shift. An exemplary driver can include a first voltage generator for generating the on voltage and shifting the voltage at the summing node by a first voltage shift, and a second voltage generator for generating the off voltage and shifting the voltage at the summing node by a second voltage shift. In some embodiments, the exemplary driver can include a buffer for buffering the voltage at the summing node and providing a buffered voltage to the first and second voltage generators.

Because the signal at the input to the ADC comes from a source that is off chip, the input of the ADC can sometimes be overloaded, where the voltage can be above or below a normal range of voltages. During an overload condition at the input terminal of the ADC, the voltage at the summing node deviates. The transistors can be damaged if not driven properly. To ensure the terminal-to-terminal voltage for the transistor does not exceed the maximum allowable amount, the on and off voltages can move with the voltage at the summing node. The first voltage generator and the second voltage generator can include source followers coupled to the summing node. A source follower circuit can be coupled to the summing node, and the circuit can upshift or downshifts the voltage at the summing node by a fixed amount of voltage.

The protection circuit is particularly useful for core MOSFETS, or other MOSFETS where maximum allowable terminal-to-terminal voltage specification of the transistors is relatively low, e.g., less than or equal to 1 volt. Core MOSFETS may be preferable over other transistors due to core MOSFETS' performance with respect to distortions, and they may be used within the tunable resistors at the input of a continuous time delta-sigma ADC, or a continuous time pipeline ADC.

EXAMPLES

Example 1 is a method for protecting a tunable resistor circuit at an input of an analog-to-digital converter (ADC), the method comprising: generating a first voltage and a second voltage based on a voltage at a summing node of an operational amplifier of the ADC; and driving a transistor coupled to a resistor slice of the tunable resistor circuit with the first voltage to switch in the resistor slice; wherein the transistor is coupled to the summing node and the resistor slice is coupled to an input terminal of the ADC and the transistor.

In Example 2, Example 1 can include driving the transistor with the second voltage to switch out the resistor slice.

In Example 3, any one of the above Examples can further include generating the first voltage comprising shifting the voltage at the summing node by a first DC voltage shift.

In Example 4, any one of the above Examples can further include generating the second voltage comprising shifting the voltage at the summing node by a second DC voltage shift.

In Example 5, any one of the above Examples can further include generating the first voltage comprising up shifting the voltage at the summing node up by a first voltage shift; and generating the second voltage comprising down shifting the voltage at the summing node down by a second voltage shift.

In Example 6, any one of the above Examples can further include driving the transistor with the first voltage turning on the transistor; and driving the transistor with the second voltage turning off the transistor.

In Example 7, any one of the above Examples can further include switching the resistor slice in and out adjusting an overall resistance of the tunable resistor.

In Example 8, any one of the above Examples can further include the voltage at the summing node deviating in response to an overload condition at the input of the ADC; and the first voltage and the second voltage following the voltage at the summing node to limit gate to drain voltage and gate to source voltage of the transistor.

Example 9 is a tunable resistor circuit at an input of an analog-to-digital converter (ADC), the tunable resistor comprising: resistor slices in parallel, wherein each resistor slice is coupled to an input terminal of the ADC; transistors coupled to respective resistor slices and a summing node of an operational amplifier of the ADC for switching the resistor slices in and out of the tunable resistor circuit; and drivers coupled to respective transistors for generating on and off voltages for the transistors from a voltage at the summing node.

In Example 10, any one of the above Examples can further include the on voltage turning on a first transistor of the transistors and switching a first resistor slice of the resistor slices in, and the off voltage turning off the first transistor and switching the first resistor slice out.

In Example 11, any one of the above Examples can further include: the on voltage being the voltage at the summing node plus a first voltage shift; and the off voltage being the voltage at the summing node minus a second voltage shift.

In Example 12, any one of the above Examples can further include: a first driver of the drivers comprising: a first voltage generator for generating the on voltage and shifting the voltage at the summing node by a first voltage shift; and a second voltage generator for generating the off voltage and shifting the voltage at the summing node by a second voltage shift.

In Example 13, any one of the above Examples can further include the first driver further comprising a buffer for buffering the voltage at the summing node and providing a buffered voltage to the first and second voltage generators.

In Example 14, any one of the above Examples can further include: the voltage at the summing node deviating during an overload condition at the input terminal of the ADC; and the on and off voltages following the voltage at the summing node.

In Example 15, any one of the above Examples can further include: the first voltage generator and the second voltage generator comprising source followers coupled to the summing node.

In Example 16, any one of the above Examples can further include: a first resistor slice of the resistor slices being coupled to a drain of a first transistor of the transistors; a source of the first transistor of the transistors is coupled to the summing node; and a gate of the first transistor is coupled to a first driver of the drivers.

In Example 17, any one of the above Examples can further include:maximum allowable terminal-to-terminal voltage specification of the transistors being less than or equal to 1 volt.

In Example 18, any one of the above Examples can further include: the ADC being a continuous time delta-sigma ADC.

In Example 19, any one of the above Examples can further include: the ADC being a continuous time pipeline ADC.

Example 20 is an apparatus comprising: a tunable resistor circuit having parallel resistor slices and corresponding switches, said tunable resistor circuit being coupled to an input of an ADC and a summing node of an operational amplifier of the ADC; and means for generating voltages for controlling on and off states of the switches, wherein the voltages follow a voltage of the summing node.

In Example 21, Example 20 can include one or more means for implementing any one or more functions described herein.

Other Implementation Notes, Variations, and Applications

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+ MHz. In some embodiments, the protection circuit for the tunable resistor can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p-p input full-scale. A dither block adds a 1-bit 1/2-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing.

In some embodiments, an apparatus comprises a tunable resistor circuit having parallel resistor slices and corresponding switches, said tunable resistor circuit being coupled to an input of an ADC and a summing node of an operational amplifier of the ADC. The apparatus further includes means for generating voltages for controlling on and off states of the switches, wherein the voltages follow a voltage of the summing node. The means can include the circuitry illustrated in FIGS. 7-10 and various embodiments described herein.

One skilled in the art would appreciate that the tunable resistor structure having switches can be implemented for both differential paths of the circuit, even though only one set of switchable resistor slices are shown in the FIGURES herein (and in some cases only one switchable resistor slice is shown to further simplify the circuit diagram). The other tunable resistor structure for the other differential path envisioned by the disclosure is omitted in the FIGURES herein for simplicity.

While the embodiments described herein are described in relation to protection circuits for tunable resistor at the input of a CT DS ADC, a CT MASH ADC, or a CT pipeline ADC, these types of CS ADCs are not meant to be limiting to the disclosure. Furthermore, the embodiments described herein can be applicable to a variety of converters, including other CT MASH ADC architectures, DT MASH ADC architectures, and CT pipeline ADCs, DT pipeline ADCs, etc. It is noted, though, that some of the embodiments described herein can be particularly useful for CT ADCs. In some embodiments, the protection circuit can be applicable to the input circuit structure of various ADCs, including continuous-time ADCs (which uses continuous-time circuits), discrete-time ADCs (which uses switched-capacitor circuits), or a hybrid continuous-time and discrete-time ADC. While some examples herein relate to a 1-2 MASH ADC, the protection circuits are applicable to MASH ADCs having different order modulators (e.g., a 2-2 MASH ADCs), or MASH ADCs having more than two stages.

The protection circuit is particularly useful for protecting the core MOSFETs (or other MOSFETs whose terminal-to-terminal voltage is as low as the core MOSFETs, thereby being more susceptible to damage) which are coupled to the input to the overall ADC through the resistor slices. Since the input to the overall ADC is not controlled by the ADC, the input to the ADC can be overloaded, and the core MOSFETs would require protection.

Switches or transistors can be used to connect the gate of the transistor 410 of the FIGURES to the ON or OFF voltages generated from the voltage at the opamp summing node. Such switches or transistors may be driven by control signals indicating whether a resistor slice is to be switched in or out. These switches can leverage some of the teachings of the switch circuit described in US2013/0033291 (entitled "MULTI-OUTPUT-RESISTANCE SWITCH DRIVER CIRCUITS") to improve performance by controlling the driving impedance to the switches. US2013/0033291 is hereby incorporated by reference in its entirety.

The present architecture for the protection circuits are particularly suitable for high speed, high precision applications where continuous-time MASH ADCs or continuous-time pipeline ADCs are used. Applications which can greatly benefit from the architecture include: instrumentation, testing, spectral analyzers, military purposes, radar, wired or wireless communications, mobile telephones (especially because standards continue to push for higher speed communications), and base stations.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to protecting the tunable resistors, such as the processes shown in FIG. 11, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method for protecting a tunable resistor circuit at an input of an analog-to-digital converter (ADC), the method comprising:
    generating a first voltage and a second voltage based on a voltage at a summing node of an operational amplifier of the ADC; and
    driving a transistor coupled to a resistor slice of the tunable resistor circuit with the first voltage to switch in the resistor slice;
    wherein the transistor is coupled to the summing node and the resistor slice is coupled to an input terminal of the ADC and the transistor.

2. The method of claim 1, further comprising:
    driving the transistor with the second voltage to switch out the resistor slice.

3. The method of claim 1, wherein:
    generating the first voltage comprises shifting the voltage at the summing node by a first DC voltage shift.

4. The method of claim 2, wherein:
    generating the second voltage comprises shifting the voltage at the summing node by a second DC voltage shift.

5. The method of claim 2, wherein:
    generating the first voltage comprises up shifting the voltage at the summing node up by a first voltage shift; and
    generating the second voltage comprises down shifting the voltage at the summing node down by a second voltage shift.

6. The method of claim 2, wherein:
    driving the transistor with the first voltage turns on the transistor; and
    driving the transistor with the second voltage turns off the transistor.

7. The method of claim 1, wherein:
    switching the resistor slice in and out adjusts an overall resistance of the tunable resistor circuit.

8. The method of claim 2, wherein:
    the voltage at the summing node deviates in response to an overload condition at the input of the ADC; and
    the first voltage and the second voltage follow the voltage at the summing node to limit gate to drain voltage and gate to source voltage of the transistor.

9. A tunable resistor circuit at an input of an analog-to-digital converter (ADC), the tunable resistor comprising:
    resistor slices in parallel, wherein each resistor slice is coupled to an input terminal of the ADC;
    transistors coupled to respective resistor slices and a summing node of an operational amplifier of the ADC for switching the resistor slices in and out of the tunable resistor circuit; and
    drivers coupled to respective transistors for generating on and off voltages for the transistors from a voltage at the summing node.

10. The tunable resistor circuit of claim 9, wherein the on voltage turns on a first transistor of the transistors and switches a first resistor slice of the resistor slices in, and the off voltage turns off the first transistor and switches the first resistor slice out.

11. The tunable resistor circuit of claim 9, wherein:
the on voltage is the voltage at the summing node plus a first voltage shift; and
the off voltage is the voltage at the summing node minus a second voltage shift.

12. The tunable resistor circuit of claim 9, wherein a first driver of the drivers comprises:
a first voltage generator for generating the on voltage and shifting the voltage at the summing node by a first voltage shift; and
a second voltage generator for generating the off voltage and shifting the voltage at the summing node by a second voltage shift.

13. The tunable resistor circuit of claim 12, wherein the first driver further comprises a buffer for buffering the voltage at the summing node and providing a buffered voltage to the first and second voltage generators.

14. The tunable resistor circuit of claim 9, wherein:
the voltage at the summing node deviates during an overload condition at the input terminal of the ADC; and
the on and off voltages follow the voltage at the summing node.

15. The tunable resistor circuit of claim 12, wherein the first voltage generator and the second voltage generator comprise source followers coupled to the summing node.

16. The tunable resistor circuit of claim 9, wherein:
a first resistor slice of the resistor slices is coupled to a drain of a first transistor of the transistors;
a source of the first transistor of the transistors is coupled to the summing node; and
a gate of the first transistor is coupled to a first driver of the drivers.

17. The tunable resistor circuit of claim 9, wherein maximum allowable terminal-to-terminal voltage specification of the transistors is less than or equal to 1 volt.

18. The tunable resistor circuit of claim 9, wherein the ADC is a continuous time delta-sigma ADC.

19. The tunable resistor circuit of claim 9, wherein the ADC is a continuous time pipeline ADC.

20. An apparatus comprising:
a tunable resistor circuit having parallel resistor slices and corresponding switches, said tunable resistor circuit being coupled to an input of an ADC and a summing node of an operational amplifier of the ADC; and
means for generating voltages for controlling on and off states of the switches, wherein the voltages follow a voltage of the summing node.

* * * * *